(12) United States Patent
Gilson

(10) Patent No.: US 8,488,859 B2
(45) Date of Patent: Jul. 16, 2013

(54) METHOD FOR FAT FRACTION QUANTIFICATION IN MAGNETIC RESONANCE IMAGING

(75) Inventor: Wesley D. Gilson, Pasadena, MD (US)

(73) Assignee: Siemens Aktiengesellschaft, Munich (DE)

( * ) Notice: Subject to any disclaimer, the term of this patent is extended or adjusted under 35 U.S.C. 154(b) by 302 days.

(21) Appl. No.: 12/910,909

(22) Filed: Oct. 25, 2010

(65) Prior Publication Data

US 2011/0096974 A1  Apr. 28, 2011

Related U.S. Application Data

(60) Provisional application No. 61/255,553, filed on Oct. 28, 2009.

(51) Int. Cl.
  *G06K 9/00*  (2006.01)
(52) U.S. Cl.
  USPC .......................................................... 382/131
(58) Field of Classification Search
  None
  See application file for complete search history.

(56) References Cited

U.S. PATENT DOCUMENTS

2005/0215882 A1* 9/2005 Chenevert et al. ............ 600/410

OTHER PUBLICATIONS

Börnert, P., Keupp, J., Eggers, H. and Aldefeld, B. (2007), Whole-body 3D water/fat resolved continuously moving table imaging. J. Magn. Reson. Imaging, 25: 660-665. doi: 10.1002/jmri.20861 Author Information: Philips Research Laboratories Hamburg, Hamburg, Germany.*

Hu—Obesity (Silver Spring). Author manuscript; available in PMC Apr. 1, 2010. Published in final edited form as: Obesity (Silver Spring). Published online Oct. 15, 2009. doi: 10.1038/oby.2009. 352PMCID: PMC2847037 NIHMSID: NIHMS169758Comparison of Fat-Water MRI and Single-voxel MRS in the Assessment of Hepatic and Pancre.*

* cited by examiner

*Primary Examiner* — Stephen R Koziol
*Assistant Examiner* — Amandeep Saini
(74) *Attorney, Agent, or Firm* — Donald B. Paschburg; F. Chau & Associates, LLC

(57) ABSTRACT

A method for determining a concentration of fat within a region of a subject includes acquiring at least three gradient echo images from at least two different flip angles. The first and third images occur at an in-phase time when resonance signals of fat and water are in-phase with one another. The second images occur at an opposed-phase time when the resonance signals of fat and water are 180° out of phase with one another. T2* and T1 relaxation time maps are approximated based on the acquired images. Fat and water signals are distinguished based on observed relative signal phase. The amplitude of the fat and water signals are modulated using the T2* and T1 relaxation time maps. A ratio between fat and water signals for one or more voxels of the images is calculated based on the amplitude modulated fat and water signal images.

21 Claims, 4 Drawing Sheets

METHOD FOR FAT FRACTION QUANTIFICATION IN MAGNETIC RESONANCE IMAGING

CROSS-REFERENCE TO RELATED APPLICATION

The present application is based on provisional application Ser. No. 61/255,553, filed Oct. 28, 2009, the entire contents of which are herein incorporated by reference.

BACKGROUND OF THE INVENTION

1. Technical Field

The present disclosure relates to MRI and, more specifically, to a method for fat fraction quantification in MRI.

2. Discussion of Related Art

Quantifying a level of fat and water within a particular region of the body has important diagnostic value. For example, quantification of fat and water may be helpful in diagnosing and monitoring the progression of fatty liver disease. Additionally, the ability to accurately quantify fat within various regions of the body may be used to measure certain risks posed by the presence of visceral fat.

The Dixon technique, first described by W. T. Dixon in 1984, exploits a chemical shift of approximately 3.4 ppm between fat and water. This chemical shift results in a shift in the resonance frequencies of fat and water. When used in conjunction with a number of image acquisition schemes such as two-dimensional RF spin echo, two-dimensional turbo spin echo, two-dimensional and three-dimensional gradient echo, spiral, RARE, GESFIDE, and others, this difference in resonance frequencies can be exploited to produce fat-only and water-only images of the body. Such images may be produced by comparing a sample image taken when the fat and water signals are exactly in-phase with each other (a 0 degree phase shift) with a sample image taken when the fat and water signals are exactly out of phase (a 180 degree phase shift).

For example, where the in-phase echo image is represented as $I_1$ and the opposed phase echo image is represented as $I_2$, the water image W and the fat image F may be computed as:

$$W = \frac{1}{2}(I_1 + I_2) \quad (1a)$$

$$F = \frac{1}{2}(I_1 - I_2) \quad (1b)$$

However, as this approach for distinguishing between fat and water relies on the phase of the resonance signals, calculating the water image and the fat image are highly susceptible to phase errors such as those resulting from B0 inhomogeneity ($\phi$) and phase errors resulting from other system imperfections ($\phi_0$) such as eddy current, concomitant gradients, B1 inhomogeneity and the like. Thus the effects of phase errors in the in-phase and opposed-phase echo images $I_1$ and $I_2$ may be approximated according to the following:

$$I_1 = (W+F)e^{i\phi_0} \quad (2a)$$

$$I_2 = (W+F)e^{i(\phi_0+\phi)} \quad (2b)$$

Moreover, in certain cases, T1 weighting and T2* signal loss may interfere with accurate fat/water separation. Accordingly, known approaches to quantification of fat and water ratios employ a two-dimensional imaging strategy such as GRE and use interleaved multi-slice, multi-echo imaging with longer repetition times (TR). Using these known two-dimensional approaches, T2* effects can be compensated and T1 weighting effects can be reduced, but spatial resolution is sacrificed. Conversely, known three-dimensional approaches improve the spatial resolution but commonly use a two echo acquisition strategy with no consideration for T1 weighting and T2* decay when generating separate fat and water images. Thus, existing approaches for quantification of fat and water ratios suffer from various limitations associated with reduced spatial resolution, long repetition times, T1 weighting, T2* decay contamination and/or long acquisition times.

SUMMARY

A method for determining a concentration of fat within a region of a subject includes acquiring at least three gradient echo images from at least two different flip angles. The first and third images occur at an in-phase time when resonance signals of fat and water are in-phase with one another. The second images occur at an opposed-phase time when the resonance signals of fat and water are 180° out of phase with one another. T2* and T1 relaxation time maps are approximated based on the acquired images. Fat and water signals are distinguished based on observed relative signal phase. The amplitude of the fat and water signals are modulated using the T2* and T1 relaxation time maps. A ratio between fat and water signals for one or more voxels of the images is calculated based on the amplitude modulated fat and water signal images.

A computer system includes a processor and a non-transitory, tangible, program storage medium, readable by the computer system, embodying a program of instructions executable by the processor to perform method steps for determining a concentration of fat within a region of a subject. The method includes acquiring at least three gradient echo images of a region of a subject from at least two different flip angles within a repetition time that occurs within a single breath hold. The first and third gradient echo images occur at an in-phase time when a resonance signals of fat and water are in-phase with one another and second gradient echo images occur at an opposed-phase time when the resonance signals of fat and water are 180° out of phase with one another. A T2* relaxation map is approximated from the in-phase gradient echo images based on the $\alpha_1$ flip angle or the $\alpha_2$ flip angle. A T1 relaxation time map is approximated from the in-phase gradient echo images based on the $\alpha_1$ flip angle and the $\alpha_2$ flip angle. Fat and water signals are distinguished within the gradient echo images based on observed relative signal phase. A ratio between fat and water is determined within one or more voxels of the gradient echo images based on the distinguished fat and water signals and the approximated T2* relaxation time map and the approximated T1 relaxation time map. The gradient echo images are acquired in one of the following orders: e1 as an in-phase echo, then e2 as an opposed-phase echo, and then e3 as an in-phase echo; or e1 as an opposed-phase echo, then e2 as an in-phase echo, and then e3 as an in-phase echo For example, for imaging performed at 1.5 T, in-phase echoes may occur at multiples of 4.76 ms, 9.52 ms, etc and opposed-phase echoes may occur at 2.38 ms, 7.13 ms, etc. Accordingly, e1 may be chosen to be 2.38 ms (if opposed-phase) or 4.76 ms (if in-phase); e2 would be 4.76 ms (if in-phase) or 7.13 ms (if opposed-phase); e3 would be 9.52 ms (or any other great in-phase time).

A system for determining a concentration of fat within a region of a subject includes a magnetic resonance imaging scanner for least three gradient echo images of a region of a subject from at least two different flip angles within a repetition time that occurs within a single breath hold. The first and third gradient echo images occur at an in-phase time when resonance signals of fat and water are in-phase with one another and second gradient echo images occur at an opposed-phase time when the resonance signals of fat and water are 180° out of phase with one another. A computing device approximates a T2* relaxation time map and a T1 relaxation map from the in-phase gradient echo images. A computing device distinguishes between fat and water signals within the gradient echo images based on observed relative signal phase and determining a ratio between fat and water within one or more voxels of the gradient echo images based on the distinguished fat and water signals and the approximated T2* relaxation time map and the approximated T1 relaxation time map.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
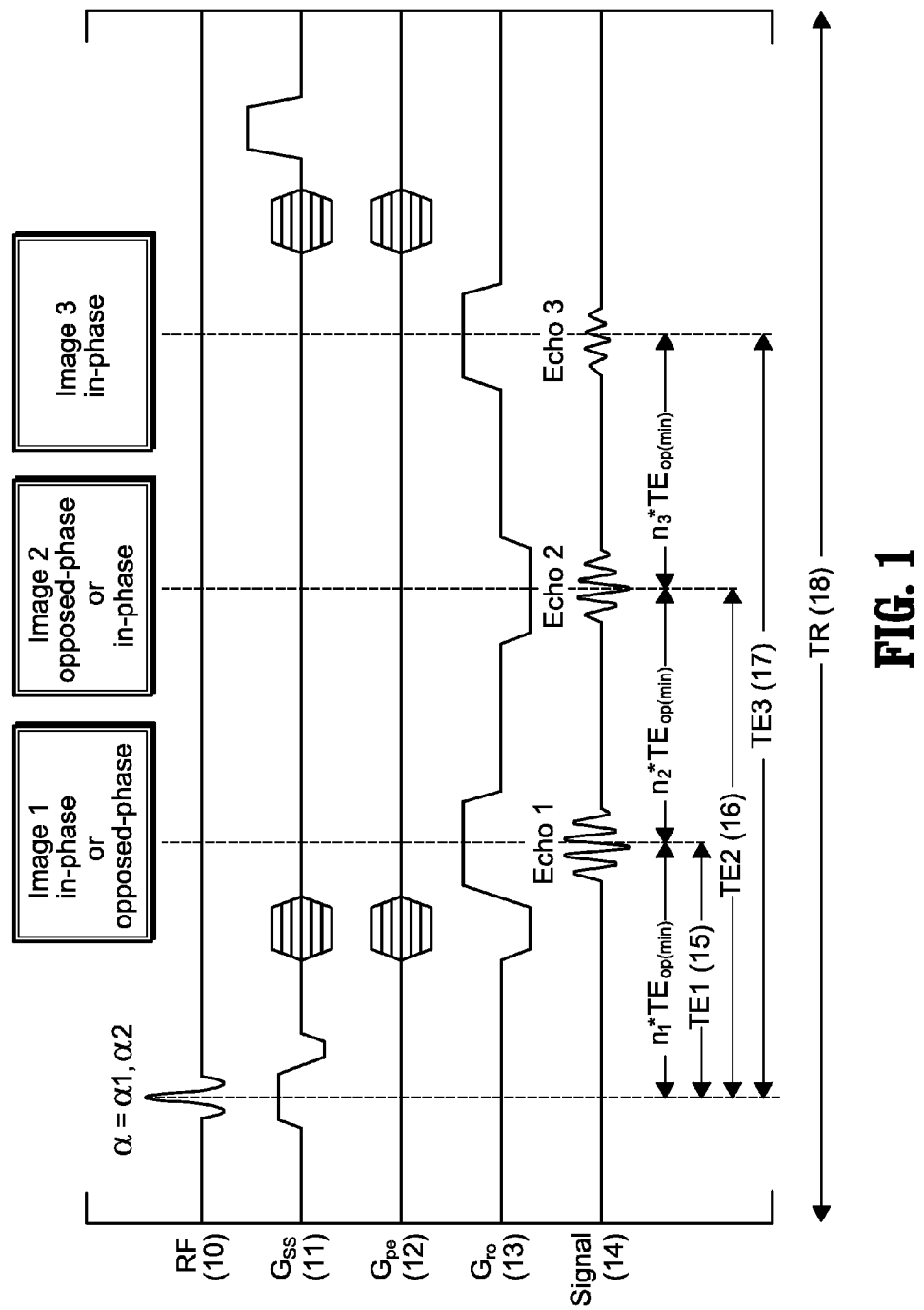
FIG. 1 is a timing diagram illustrating a pulse sequence illustrating a triple-echo gradient echo acquisition repeated using two different flip angles according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention provide approaches for quantification of fat and water within magnetic resonance imaging (MRI) that are able to accurately ascertain a fat fraction (the ratio of fat proton density to total fat and water proton density) within a single image voxel without having to rely on interleaving or long repetition times so that three-dimensional gradient echo approaches to image acquisition may be used along with shorter repetition times (TR) that may allow for image acquisition within a single breath hold.

For example, a triple echo gradient echo pulse sequence may be acquired using two different flip angles ($\alpha 1, \alpha 2$). FIG. 1 is a timing diagram illustrating a pulse sequence containing a triple-echo gradient echo acquisition repeated using two different flip angles according to an exemplary embodiment of the present invention. Signal 14 represents the acquired signal within a given repetition time (TR) 18. It is shown that the acquired signal 14 is active for three occasions thereby representing that three echo signals are acquired. A collection of echo signals "Echo 1" acquired in a measurement of multiple repetition time (TR) 18 and corresponding to the first occasion comprise the data used to reconstruct "Image 1". Similarly, a collection of echo signals "Echo 2" acquired in a measurement of multiple repetition time (TR) 18 and corresponding to the second occasion comprise the data used to reconstruct "Image 2", and so on for "Image 3". "Image 1," may be an in-phase or an opposed-phase image. "Image 2" may be either an opposed-phase image or an in-phase image. "Image 3" is an in-phase image. Thus, while Image 1 is in-phase, Image 2 is opposed-phase and visa versa while Image 3 is always in-phase. The images created from the two in-phase echo data may be used to estimate T2*. This is because the two in-phase echoes comprise the fat and water signals added together and accordingly, the only difference between the two echoes is the time of echo acquisition (TE) which decays with a rate constant to T2*. This relationship between the in-phase images and T2* is described in greater detail below with respect to equation 5a.

The third echo may be acquired at the first available in-phase echo after the second echo to minimize the repetition time TR. However, exemplary embodiments of the present invention are not limited to this selection and accordingly, selection of an echo at a later in-phase echo may be used to increase accuracy of the T2* estimation. The TR may, however, be selected to be within a single breath hold and accordingly, the third echo may occur at a last possible in-phase echo that still occurs within a reasonable length of time in which a subject could be expected to hold his or her breath.

Signal 10 represents an applied radio-frequency (RF) pulse. The RF pulse is transmitted with a flip angle $\alpha$ that is either a low flip angle $\alpha 1$ or a high flip angle $\alpha 2$. The RF pulse 10 is shown as being applied for each repetition time TR (18).

A slice selection gradient signal ($G_{ss}$) 11 is used to select the desired imaging volume. A readout gradient ($G_{ro}$) 13 is used to encode the MR signal into different frequencies for given spatial locations and does not change for each TR (18). A phase encoding gradient signal ($G_{pe}$) 12 is used to encode the MR signal in a second spatial direction using spin phase. $G_{pe}$ 12 is modulated for each period TR to collect all echoes needed to generate a two-dimensional image. For three-dimensional imaging, $G_{ss}$ 11 is also modulated for each $G_{pe}$ 12 gradient value to collect all echoes needed to generate a three-dimensional image.

The total time in which all three images are acquired may be divided as shown in lines 15, 16, 17, and 18. $TE_{op(min)}$ represents the minimum echo time at which fat and water resonance signals are 180° out of phase and is used to represent a base unit by which the time of the image acquisitions are measured. Here, $n_1$, $n_2$, and $n_3$ are integers used to indicate multiples of $TE_{op(min)}$ at which signal acquisitions occur. Odd-numbered n's represent times at which fat and water resonance signals are 180° out of phase and even-numbered n's represent times at which fat and water resonance signals are in-phase. For example, Image 1 occurs at time $n_{1\times}TE_{op(min)}$ ("TE1"), Image 2 occurs at time $n_{2\times}TE_{op(min)}$ ("TE2"), and Image 3 occurs at time $n_{3\times}TE_{op(min)}$ ("TE3"). In the three lines 15, 16, and 17, the echo time for each acquisition is shown with the echo time for the acquisition of the first image occurring at TE1 (15), the echo time for the acquisition of the second image occurring at TE2 (16), and the echo time for the acquisition of the third image occurring at TE3 (17). Line 18 illustrates the repetition time TR which represents the time between RF pulses and is greater than the TE3.

The triple-echo gradient echo acquisition described above may be repeated twice with different flip angles for use in estimating T1. This is because T1 may be estimated using as few as two flip angles where the flip angles used are selected optimally for the tissue being interrogated.

For the case of a 3D gradient echo sequence, the steady-state equation for an incoherent steady-state signal may be represented as:

$$S = M_0 \sin\alpha \frac{(1 - e^{-TR/T1})}{1 - \cos\alpha e^{-TR/T1}} e^{-TE/T2^*} \quad (3)$$

This equation (3) may be used to represent the signal (S) for each individual voxel within the 3D gradient echo sequence before fat and water are separated. As described above, in the triple echo sequence, the three echoes e1, e2, and e3 are acquired at each flip angle $\alpha 1$ and $\alpha 2$. Thus, the set of echoes may be described as e1($\alpha 1$), e2($\alpha 1$), e3($\alpha 1$), e1($\alpha 2$), e2($\alpha 2$), and e3($\alpha 2$), and the corresponding signals for each individual echo within the acquisition may be designated as $S_{e1,\alpha 1}$, $S_{e2,\alpha 1}$, $S_{e3,\alpha 1}$, $S_{e1,\alpha 2}$, $S_{e2,\alpha 2}$, and $S_{e3,\alpha 2}$.

Based on equation (3), the signals for each individual echo in the acquisition may be written as follows:

For $\alpha = \alpha 1$:

$$S_{e1,\alpha 1} = M_{0,e1} \sin(\alpha_1) \frac{(1 - e^{-TR/T1})}{1 - \cos(\alpha_1) e^{-TR/T1}} e^{-TE1/T2^*} \quad (4a)$$

$$S_{e2,\alpha 1} = M_{0,e2} \sin(\alpha_1) \frac{(1 - e^{-TR/T1})}{1 - \cos(\alpha_1) e^{-TR/T1}} e^{-TE2/T2^*} \quad (4b)$$

$$S_{e3,\alpha 1} = M_{0,e3} \sin(\alpha_1) \frac{(1 - e^{-TR/T1})}{1 - \cos(\alpha_1) e^{-TR/T1}} e^{-TE3/T2^*} \quad (4c)$$

For $\alpha = \alpha 2$:

$$S_{e1,\alpha 2} = M_{0,e1} \sin(\alpha_2) \frac{(1 - e^{-TR/T1})}{1 - \cos(\alpha_2) e^{-TR/T1}} e^{-TE1/T2^*} \quad (4d)$$

$$S_{e2,\alpha 2} = M_{0,e2} \sin(\alpha_2) \frac{(1 - e^{-TR/T1})}{1 - \cos(\alpha_2) e^{-TR/T1}} e^{-TE2/T2^*} \quad (4e)$$

$$S_{e3,\alpha 2} = M_{0,e3} \sin(\alpha_2) \frac{(1 - e^{-TR/T1})}{1 - \cos(\alpha_2) e^{-TR/T1}} e^{-TE3/T2^*} \quad (4f)$$

Here, $M_0$ refers to the initial magnetization, which is known to be proportional to the proton density within the tissue being interrogated. $M_{0,e1}$ represents the initial magnetization for the first echo e1. $M_{0,e2}$ represents the initial magnetization for the second echo e2, and so on.

Exemplary embodiments of the present invention seek to determine a map of T2* and use this map to correct for the effects of T2* decay and to determine a map of T1 to mitigate the effects of T1 weighting as these qualities may interfere with accurate fat/water quantification. Accordingly, by obtaining these maps, the signal contribution from fat and water can be more accurately estimated from 2D and 3D gradient echo imaging.

Figure 2:
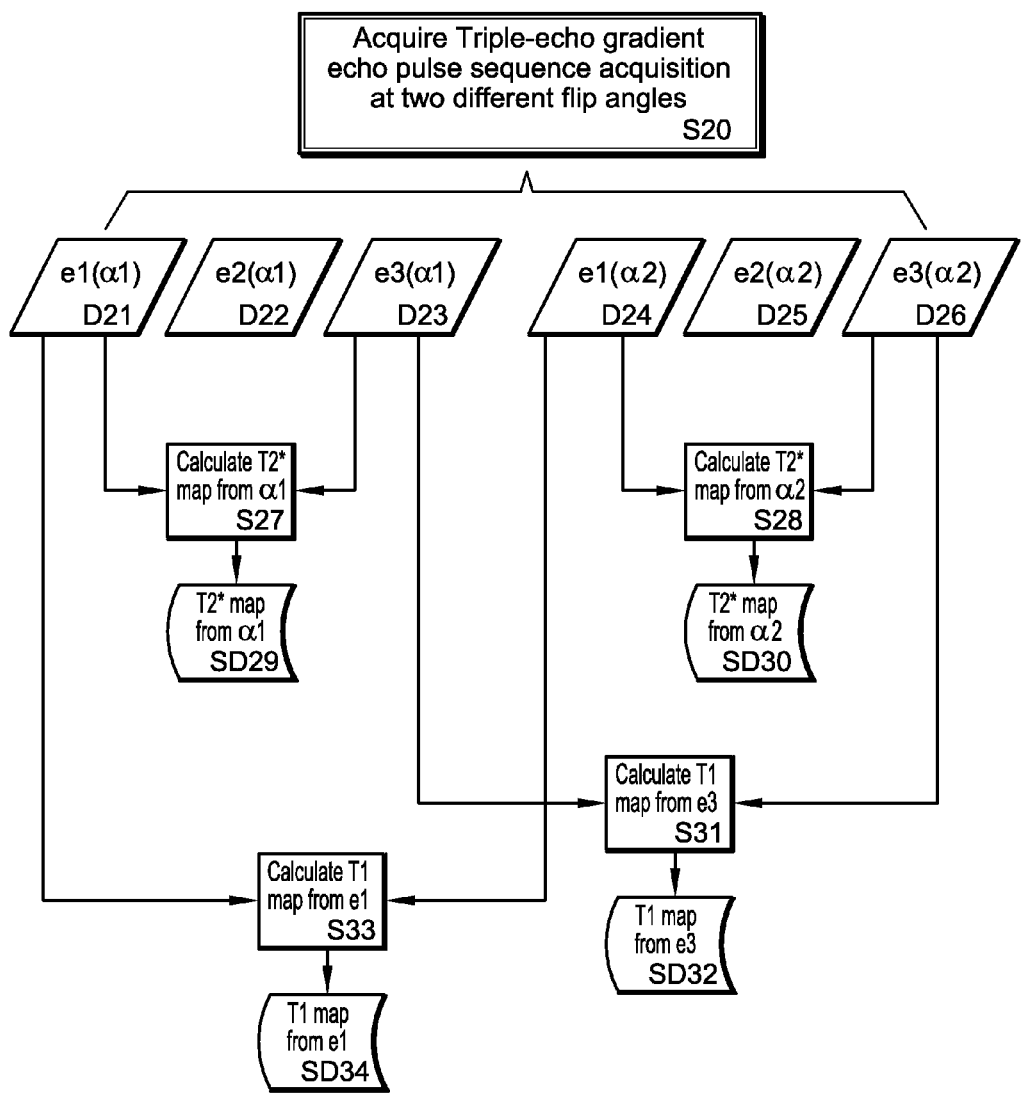
FIG. 2 is a flow chart illustrating how the acquired images may be organized in computing T2* and T1 according to an exemplary embodiment of the present invention.

Thus exemplary embodiments of the present invention seek to solve for T2* and T1. In theory, the initial magnetization $M_0$ should be identical for all echoes that are in-phase. Similarly, $M_0$ should be identical for all echoes that are opposed phase. These equalities may be assumed in solving for T2*. FIG. 2 is a flow chart illustrating how the acquired images may be organized in computing T2* and T1 according to an exemplary embodiment of the present invention.

The triple-echo gradient echo pulse sequence acquisition at two different flip angles described in detail above may result in six echoes, with the first three having been acquired at the first flip angle $\alpha 1$: e1($\alpha 1$) D21, e2($\alpha 1$) D22, e3($\alpha 1$) D23 and the second three having been acquired at the second flip angle $\alpha 2$: e1($\alpha 2$) D24, e2($\alpha 2$) D25, and e3($\alpha 2$) D26.

After image acquisition (Step S20), a T2* map may be calculated from the $\alpha 1$ echoes (Step S27). The calculated T2* map value may then be stored (stored data SD29). Similarly, a T2* map may be calculated from the $\alpha 2$ echoes (Step S28). The calculated T2* map values may then be stored (stored data SD30). Each of the T2* maps may be generated by solving for T2*. It may be assumed herein for the purposes of providing a simplified explanation that the first and third echoes e1 and e3 (for each of $\alpha 1$ and $\alpha 2$) represent in-phase echoes while the second echoes e2 (for each of $\alpha 1$ and $\alpha 2$) represent the opposed-phase echoes. However, as described above, the first echoes may be either in-phase or opposed-phase and the second echoes may be the other of these.

Equations 4a and 4c, so simplified, may then be expressed as follows, for the purposes of solving for T2*:

$$T2^*_{\alpha 1} = \frac{(TE3 - TE1)}{\ln(S_{e1,\alpha 1}/S_{re3,\alpha 1})} \quad (5a)$$

by simplifying equations 4a and 4c, and then $$T2^*_{\alpha 2} = \frac{(TE3 - TE1)}{\ln(S_{e1,\alpha 2}/S_{e3,\alpha 2})} \quad (5b)$$

by simplifying equations 4d and 4f. Here, equation 5a may be used to calculate the T2* map from $\alpha 1$ (Step S27) and equation 5b may be used to calculate the T2* map from $\alpha 2$ (Step S28).

Where desired, the two T2* maps for $\alpha 1$ and $\alpha 2$ may be averaged to provide for an average T2* map. This average T2* may be used as a more robust T2* map, however, this step is optional and may be omitted.

Next, a T1 map may be calculated from the e3 echoes D23 and D26 (Step S31). This T1 map may then be stored (stored data SD32). Similarly, a T1 map may be calculated from the e1 echoes D21 and D24 (Step S33) and the T1 map may then be stored (stored data SD34). Again, it is assumed that the e1 and e3 represent the in-phase acquisitions and it is for this reason that the T1 map is so computed.

Solving for the T1 maps may begin with expressing the echo signal equations in terms of E1, which may be defined as $e^{-TR/T1}$. Thus assuming that the $M_0$ and T2* terms are identical; the following expression for E1 (for e1) may be derived from equations 4a and 4b:

$$E1_{e1} = \frac{S_{e1,\alpha 1} \sin\alpha_2 - S_{e1,\alpha 2} \sin\alpha_1}{(S_{e1,\alpha 1} \sin\alpha_2 \cos\alpha_1) - (S_{e1,\alpha 2} \sin\alpha_1 \cos\alpha_2)} \quad (6a)$$

Similarly, the following expression for E1 (for e3) may be derived from equations 4c and 4f:

$$E1_{e3} = \frac{S_{e3,\alpha 1}\sin\alpha_2 - S_{e3,\alpha 2}\sin\alpha_1}{(S_{e3,\alpha 1}\sin\alpha_2\cos\alpha_1) - (S_{e3,\alpha 2}\sin\alpha_1\cos\alpha_2)} \quad (6b)$$

And accordingly, the following equations may be derived for the solving of T1 for e1 and e3:

$$T1_{e1} = \frac{-TR}{\ln\left[\frac{S_{e1,\alpha 1}\sin\alpha_2 - S_{e1,\alpha 2}\sin\alpha_1}{(S_{e1,\alpha 1}\sin\alpha_2\cos\alpha_1) - (S_{e1,\alpha 2}\sin\alpha_1\cos\alpha_2)}\right]} \quad (7a)$$

$$T1_{e3} = \frac{-TR}{\ln\left[\frac{S_{e3,\alpha 1}\sin\alpha_2 - S_{e3,\alpha 2}\sin\alpha_1}{(S_{e3,\alpha 1}\sin\alpha_2\cos\alpha_1) - (S_{e3,\alpha 2}\sin\alpha_1\cos\alpha_2)}\right]} \quad (7b)$$

As was the case for calculating the T2* maps, the two T1 maps may be averaged to provide an average T1 map. This average T1 may be used as a more robust T1 map. However, this step is optional and may be omitted.

In order to provide for proper fat/water quantification, it may be necessary to determine the initial magnetization $M_0$ for each echo. Equations 1, 2, and 3 may be solved for $M_0$ for the first and second echoes corresponding to the in-phase and opposed-phase echoes and the calculated T1 and T2* maps may be used. The following equations may therefore be derived:

For $\alpha = \alpha 1$:

$$M_{0,e1} = S_{e1,\alpha 1}\frac{1 - \cos(\alpha_1)e^{-TR/T1}}{\sin(\alpha_1)(1 - e^{-TR/T1})}e^{+TE1/T2^*} \quad (8a)$$

$$M_{0,e2} = S_{e2,\alpha 1}\frac{1 - \cos(\alpha_1)e^{-TR/T1}}{\sin(\alpha_1)(1 - e^{-TR/T1})}e^{+TE2/T2^*} \quad (8b)$$

For $\alpha = \alpha 2$:

$$M_{0,e1} = S_{e1,\alpha 2}\frac{1 - \cos(\alpha_2)e^{-TR/T1}}{\sin(\alpha_2)(1 - e^{-TR/T1})}e^{+TE1/T2^*} \quad (8c)$$

$$M_{0,e2} = S_{e2,\alpha 2}\frac{1 - \cos(\alpha_2)e^{-TR/T1}}{\sin(\alpha_2)(1 - e^{-TR/T1})}e^{+TE2/T2^*} \quad (8d)$$

The results of equations 8a and 8c may be averaged for the in-phase echoes and equations 8b and 8d may be averaged for the opposed-phase echoes. Alternatively, the results of equations 8a and 8b may be used directly to represent the in-phase and opposed-phase echoes, respectively.

Figure 3:
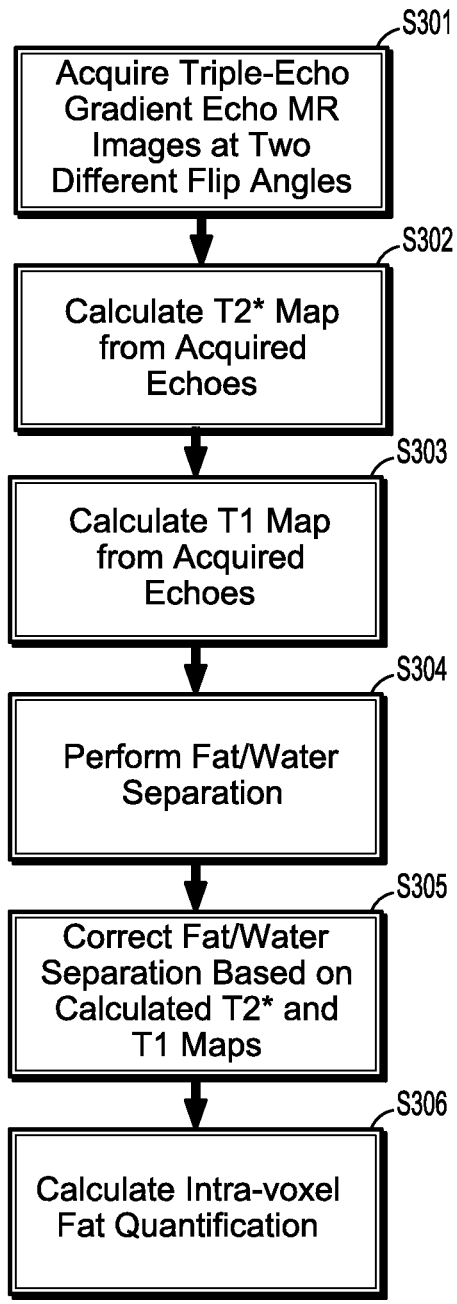
FIG. 3 is a flow chart illustrating a workflow for performing fat fraction quantification according to an exemplary embodiment of the present invention.

FIG. 3 is a flow chart illustrating a workflow for performing fat fraction quantification according to an exemplary embodiment of the present invention. First, MR images are acquired, for example, as described in detail above (Step S301). The MR images may comprise a triple echo gradient echo and may be acquired at two different flip angles. The entire acquisition, including the three echoes at the two different flip angles, for a total of six images, may span a period of time that may be comfortably within a single breath hold. This may be, for example, a period of less than thirty seconds, and preferably a period of less than twenty seconds, and more preferably, a period of less than ten seconds. This may be accomplished, for example, by setting the repetition time TR to its minimum value. Image acquisition is not limited to the six echoes described herein and any number of images may be used. For example, more than three different echoes may be acquired at more than two different flip angles. For example, four, five, six or more echoes may be acquired at three, four, five, or more different flip angles. There need not be any limit, with the understanding that the minimum TR increases as you increase the number of echoes and/or flip angles; therefore, total acquisition time increases proportionally. Moreover, methods for determining T2* and T1 could be estimated more appropriately using methods such as linear least squares fitting.

After the echoes are acquired, a T2* map may be calculated (Step S302) and a T1 map may be calculated (Step S303). As described above, the T2* map may be calculated from the in-phase echoes, separately for each flip angle while the T1 map may be calculated separately from the first of the in-phase echoes (over both flip angles) and from the second of the in-phase echoes (over both flip angles).

Fat/water separation may then be performed based on the acquired echoes (Step S304). Fat/water separation may be performed in any of a number of ways, for example, using a two-point or three-point Dixon approach. Throughout the above-described mapping and correction process, the signal magnitude may be considered. However, alternatively, the results may be directly applied as an amplitude modification of the original complex data. Therefore, B0 correction and phase unwrapping techniques, for example, those using minimum-norm or path following methods, may be applied to the data to achieve correct separation of the fat and water signals. The fat/water separation may be corrected based on the calculated T2* and T1 maps (Step S305).

Intra-voxel fat quantification may then be performed using the corrected fat/water separated image (Step S306). Assuming correct separation of fat and water images, which may be performed primarily using the voxel phase information, intra-voxel fat fraction (FF) may be quantified for the data set based on the following equation:

$$FF = \frac{F}{F + W} = \frac{M_{0,e1} - M_{0,e2}}{2M_{0,e1}} \quad (9)$$

Figure 4:
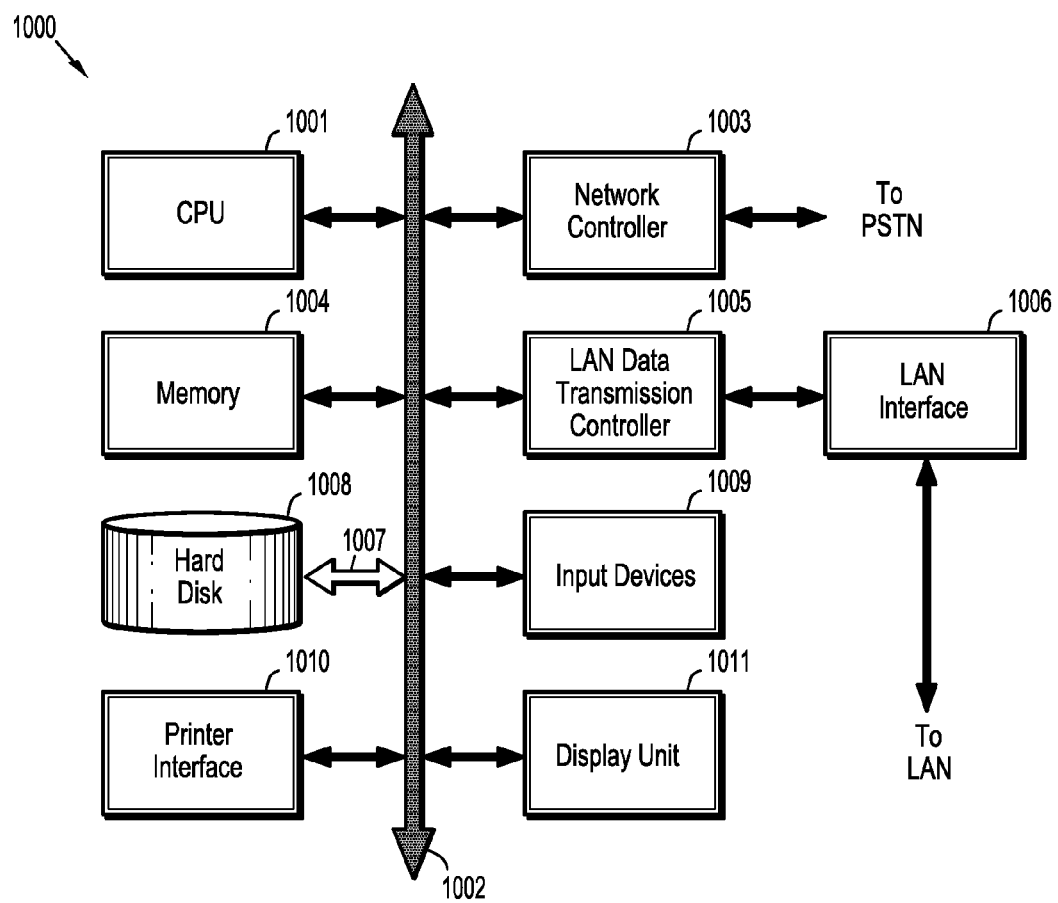
FIG. 4 shows an example of a computer system capable of implementing the method and apparatus according to embodiments of the present disclosure.

FIG. 4 shows an example of a computer system which may implement a method and system of the present disclosure. The system and method of the present disclosure may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 1000 may include, for example, a central processing unit (CPU) 1001, random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for determining a concentration of fat within a region of a subject, comprising:
acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in-phase with one another and gradient echo images $e_2\alpha_1$, and $e_2\alpha_2$ occur at an opposed-phase time when the resonance signals of fat and water are 180° out of phase with one another;
approximating a T2* relaxation time map from the in-phase gradient echo images based on the $\alpha_1$ flip angle or the $\alpha_2$ flip angle;
approximating a T1 relaxation time map from the in-phase gradient echo images based on the $\alpha_1$ flip angle and the $\alpha_2$ flip angle;
distinguishing between fat and water signals within the gradient echo images based on observed relative signal phase;
modulating the amplitude of the fat and water signal images using the T2* relaxation time and T1 relaxation time maps;
determining a ratio between fat and water signals for one or more voxels of the gradient echo images based on the amplitude modulated fat and water signal images; and
displaying the determined ratio between fat and water for a desired voxel of the gradient echo images,
wherein the T2* relaxation time map is approximated from the in-phase gradient echo images according to the following equations:

$$T2^*_{\alpha 1} = \frac{(TE3 - TE1)}{\ln(S_{e1,\alpha 1}/S_{e3,\alpha 1})} \text{ and } T2^*_{\alpha 2} = \frac{(TE3 - TE1)}{\ln(S_{e1,\alpha 2}/S_{e3,\alpha 2})}$$

where TE1 is a time of the acquisition of the $e_1$ images, TE3 is a time of the acquisition of the $e_3$ images, $S_{e1,\alpha 1}$ is a signal of the $e_1\alpha_1$ gradient echo image, $S_{e3,\alpha 1}$ is a signal of the $e_3\alpha_1$ gradient echo image, $S_{e1,\alpha 2}$ is a signal of the $e_1\alpha_2$ gradient echo image, and $S_{e3,\alpha 2}$ is a signal of the $e_3\alpha_2$ gradient echo image.

2. The method of claim 1, wherein the gradient echo images are acquired in the following order: $e_1$ as an in-phase echo, then $e_2$ as an opposed-phase echo, and then $e_3$ as an in-phase echo.

3. The method of claim 1, wherein the gradient echo images are acquired in the following order: $e_1$ as an opposed-phase echo, then $e_2$ as an in-phase echo, and then $e_3$ as an in-phase echo.

4. The method of claim 1, wherein fat and water signals are distinguished within the gradient echo images using a two-point or three-point Dixon approach.

5. A method for determining a concentration of fat within a region of a subject, comprising:
acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in-phase with one another and gradient echo images $e_2\alpha_1$, and $e_2\alpha_2$ occur at an opposed-phase time when the resonance signals of fat and water are 180° out of phase with one another;
approximating a T2* relaxation time map from the in-phase gradient echo images based on the $\alpha_1$ flip angle or the $\alpha_2$ flip angle;
approximating a T1 relaxation time map from the in-phase gradient echo images based on the $\alpha_1$ flip angle and the $\alpha_2$ flip angle;
distinguishing between fat and water signals within the gradient echo images based on observed relative signal phase;
modulating the amplitude of the fat and water signal images using the T2* relaxation time and T1 relaxation time maps;
determining a ratio between fat and water signals for one or more voxels of the gradient echo images based on the amplitude modulated fat and water signal images; and
displaying the determined ratio between fat and water for a desired voxel of the gradient echo images,
wherein the T1 relaxation time map is approximated from the in-phase gradient echo images according to the following equations:

$$T1_{e1} = \frac{-TR}{\ln\left[\frac{S_{e1,\alpha 1}\sin\alpha_2 - S_{e1,\alpha 2}\sin\alpha_1}{(S_{e1,\alpha 1}\sin\alpha_2\cos\alpha_1) - (S_{e1,\alpha 2}\sin\alpha_1\cos\alpha_2)}\right]} \text{ and}$$

$$T1_{e3} = \frac{-TR}{\ln\left[\frac{S_{e3,\alpha 1}\sin\alpha_2 - S_{e3,\alpha 2}\sin\alpha_1}{(S_{e3,\alpha 1}\sin\alpha_2\cos\alpha_1) - (S_{e3,\alpha 2}\sin\alpha_1\cos\alpha_2)}\right]}$$

wherein $S_{e1,\alpha 1}$ is a signal of the $e_1\alpha_1$ gradient echo image, $S_{e3,\alpha 1}$ is a signal of the $e_3\alpha_1$ gradient echo image, $S_{e3,\alpha 2}$ is a signal of the $e_1\alpha_2$ gradient echo image, and $S_{e3,\alpha 2}$ is a signal of the $e_3\alpha_2$ gradient echo image.

6. The method of claim 5, wherein the gradient echo images are acquired in the following order: $e_1$ as an in-phase echo, then $e_2$ as an opposed-phase echo, and then $e_3$ as an in-phase echo.

7. The method of claim 5, wherein the gradient echo images are acquired in the following order: $e_1$ as an opposed-phase echo, then $e_2$ as an in-phase echo, and then $e_3$ as an in-phase echo.

8. The method of claim 5, wherein fat and water signals are distinguished within the gradient echo images using a two-point or three-point Dixon approach.

9. A method for determining a concentration of fat within a region of a subject, comprising:
acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in phase with one another and gradient echo images $e_2\alpha_1$, and $e_2\alpha_2$ occur at an opposed-phase time when the resonance signals of fat and water are 180° out of phase with one another;
approximating a T2* relaxation time map from the in-phase gradient echo images based on the $\alpha_1$ flip angle or the $\alpha_2$ flip angle;
approximating a T1 relaxation time map from the in-phase gradient echo images based on the $\alpha_1$ flip angle and the $\alpha_2$ flip angle;

distinguishing between fat and water signals within the gradient echo images based on observed relative signal phase;

modulating the amplitude of the fat and water signal images using the T2* relaxation time and T1 relaxation time maps;

determining a ratio between fat and water signals for one or more voxels of the gradient echo images based on the amplitude modulated fat and water signal images; and displaying the determined ratio between fat and water for a desired voxel of the gradient echo images, wherein fat and water signals are distinguished within the gradient echo images using a two-point or three-point Dixon approach, wherein the gradient echo images are acquired in the following order: $e_1$ then $e_2$ then $e_3$;

the water signal W is determined as $\frac{1}{2}$ ($M_{0,e1}$+$M_{0,e2}$); and the fat signal F is determined as $\frac{1}{2}$ ($M_{0,e1}$−$M_{0,e2}$), wherein $M_{0,e1}$ is the initial magnetization of the e1 image and $M_{0,e2}$ is the initial magnetization of the e2 image, and wherein the initial magnetization of the e1 images $M_{0,e1}$ and the initial magnetization of the e2 images $M_{0,e2}$ are calculated according to the following equations:

$$M_{0,e1} = S_{e1,\alpha1} \frac{1-\cos(\alpha_1)e^{-TR/T1}}{\sin(\alpha_1)(1-e^{-TR/T1})} e^{+TE1/T2^*} \text{ and}$$

$$M_{0,e2} = S_{e2,\alpha1} \frac{1-\cos(\alpha_1)e^{-TR/T1}}{\sin(\alpha_1)(1-e^{-TR/T1})} e^{+TE2/T2^*} \text{ for } \alpha1, \text{ and}$$

$$M_{0,e1} = S_{e1,\alpha2} \frac{1-\cos(\alpha_2)e^{-TR/T1}}{\sin(\alpha_2)(1-e^{-TR/T1})} e^{+TE1/T2^*} \text{ and}$$

$$M_{0,e2} = S_{e2,\alpha2} \frac{1-\cos(\alpha_2)e^{-TR/T1}}{\sin(\alpha_2)(1-e^{-TR/T1})} e^{+TE2/T2^*} \text{ for } \alpha2,$$

for α2, where $S_{e1,\alpha1}$ is a signal of the $e_1\alpha_1$ gradient echo image, $S_{e2,\alpha1}$ is a signal of the $e_2\alpha_1$ gradient echo image, $S_{e1,\alpha2}$ is a signal of the $e_1\alpha_2$ gradient echo image, and $S_{e2,\alpha2}$ is a signal of the $e_2\alpha_2$ gradient echo image, TE1 is a time of the acquisition of the $e_1$ images, and TE2 is a time of the acquisition of the $e_2$ images.

10. A computer system comprising:
a processor; and
a non-transitory, tangible, program storage medium, readable by the computer system, embodying a program of instructions executable by the processor to perform method steps for determining a concentration of fat within a region of a subject, the method comprising:

acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in-phase with one another and gradient echo images $e_2\alpha_1$, and $e_2\alpha_2$ occur at an opposed-phase time when the resonance signals of fat and water are 180° out of phase with one another;

approximating a T2* relaxation time map from the in-phase gradient echo images based on the $\alpha_1$ flip angle or the $\alpha_2$ flip angle;

approximating a T1 relaxation time map from the in-phase gradient echo images based on the $\alpha_1$ flip angle and the $\alpha_2$ flip angle;

distinguishing between fat and water signals within the gradient echo images based on observed relative signal phase;

modulating the amplitude of the fat and water signal images using the T2* relaxation time and T1 relaxation time maps;

determining a ratio between fat and water signals for one or more voxels of the gradient echo images based on the amplitude modulated fat and water signal images; and displaying the determined ratio between fat and water for a desired voxel of the gradient echo images, wherein the T2* relaxation time map is approximated from the in-phase gradient echo images according to the following equations:

$$T2^*_{\alpha1} = \frac{(TE3-TE1)}{\ln(S_{e1,\alpha1}/S_{e3,\alpha1})} \text{ and } T2^*_{\alpha2} = \frac{(TE3-TE1)}{\ln(S_{e1,\alpha2}/S_{e3,\alpha2})}$$

where TE1 is a time of the acquisition of the $e_1$ images, TE3 is a time of the acquisition of the $e_3$ images, $S_{e1,\alpha1}$ is a signal of the $e_1\alpha_1$ gradient echo image, $S_{e3,\alpha1}$ is a signal of the $e_3\alpha_1$ gradient echo image, $S_{e1,\alpha2}$ is a signal of the $e_1\alpha_2$ gradient echo image, and $S_{e3,\alpha2}$ is a signal of the $e_3\alpha_2$ gradient echo image.

11. The computer system of claim 10, wherein the gradient echo images are acquired in the following order: $e_1$ as an in-phase echo, then $e_2$ as an opposed-phase echo, and then $e_3$ as an in-phase echo.

12. The computer system of claim 10, wherein the gradient echo images are acquired in the following order: $e_1$ as an opposed-phase echo, then $e_2$ as an in-phase echo, and then $e_3$ as an in-phase echo.

13. The computer system of claim 10, wherein fat and water signals are distinguished within the gradient echo images using a two-point or three-point Dixon approach.

14. A computer system comprising:
a processor; and
a non-transitory, tangible, program storage medium, readable by the computer system, embodying a program of instructions executable by the processor to perform method steps for determining a concentration of fat within a region of a subject, the method comprising:

acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in-phase with one another and gradient echo images $e_2\alpha_1$, and $e_2\alpha_2$ occur at an opposed-phase time when the resonance signals of fat and water are 180° out of phase with one another;

approximating a T2* relaxation time map from the in-phase gradient echo images based on the $\alpha_1$ flip angle or the $\alpha_2$ flip angle;

approximating a T1 relaxation time map from the in-phase gradient echo images based on the $\alpha_1$ flip angle and the $\alpha_2$ flip angle;

distinguishing between fat and water signals within the gradient echo images based on observed relative signal phase;

modulating the amplitude of the fat and water signal images using the T2* relaxation time and T1 relaxation time maps;

determining a ratio between fat and water signals for one or more voxels of the gradient echo images based on the amplitude modulated fat and water signal images; and displaying the determined ratio between fat and water for a desired voxel of the gradient echo images, wherein the T1 relaxation time map is approximated from the in-phase gradient echo images according to the following equations:

$$T1_{e1} = \frac{-TR}{\ln\left[\frac{S_{e1,\alpha1}\sin\alpha_2 - S_{e1,\alpha2}\sin\alpha_1}{(S_{e1,\alpha1}\sin\alpha_2\cos\alpha_1) - (S_{e1,\alpha2}\sin\alpha_1\cos\alpha_2)}\right]} \text{ and}$$

$$T1_{e3} = \frac{-TR}{\ln\left[\frac{S_{e1,\alpha1}\sin\alpha_2 - S_{e1,\alpha2}\sin\alpha_1}{(S_{e1,\alpha1}\sin\alpha_2\cos\alpha_1) - (S_{e3,\alpha2}\sin\alpha_1\cos\alpha_2)}\right]}$$

wherein $S_{e1,\alpha1}$ is a signal of the $e_1\alpha_1$ gradient echo image, $S_{e3,\alpha1}$ is a signal of the $e_3\alpha_1$ gradient echo image, $S_{e1,\alpha2}$ is a signal of the $e_1\alpha_2$ gradient echo image, and $S_{e3,\alpha2}$ is a signal of the $e_3\alpha_2$ gradient echo image.

15. A computer system comprising:

a processor; and a non-transitory, tangible, program storage medium, readable by the computer system, embodying a program of instructions executable by the processor to perform method steps for determining a concentration of fat within a region of a subject, the method comprising:

acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in-phase with one another and gradient echo images $e_2\alpha_1$, and $e_2\alpha_2$ occur at an opposed-phase time when the resonance signals of fat and water are 180° out of phase with one another;

approximating a T2* relaxation time map from the in-phase gradient echo images based on the $\alpha_1$ flip angle or the $\alpha_2$ flip angle;

approximating a T1 relaxation time map from the in-phase gradient echo images based on the $\alpha_1$ flip angle and the $\alpha_2$ flip angle;

distinguishing between fat and water signals within the gradient echo images based on observed relative signal phase;

modulating the amplitude of the fat and water signal images using the T2* relaxation time and T1 relaxation time maps;

determining a ratio between fat and water signals for one or more voxels of the gradient echo images based on the amplitude modulated fat and water signal images; and displaying the determined ratio between fat and water for a desired voxel of the gradient echo images, wherein fat and water signals are distinguished within the gradient echo images using a two-point or three-point Dixon approach, wherein the gradient echo images are acquired in the following order: $e_1$ then $e_2$ then $e_3$;

the water signal W is determined as ½ ($M_{0,e1}$ + $M_{0,e2}$); and the fat signal F is determined as ½ ($M_{0,e1}$ − $M_{0,e2}$), wherein $M_{0,e1}$ is the initial magnetization of the e1 image and $M_{0,e2}$ is the initial magnetization of the e2 image, and wherein the initial magnetization of the e1 images $M_{0,e1}$ and the initial magnetization of the e2 images $M_{0,e2}$ are calculated according to the following equations:

$$M_{0,e1} = S_{e1,\alpha1}\frac{1 - \cos(\alpha_1)e^{-TR/T1}}{\sin(\alpha_1)(1 - e^{-TR/T1})}e^{+TE1/T2^*} \text{ and}$$

$$M_{0,e2} = S_{e2,\alpha1}\frac{1 - \cos(\alpha_1)e^{-TR/T1}}{\sin(\alpha_1)(1 - e^{-TR/T1})}e^{+TE2/T2^*} \text{ and } \alpha1, \text{ and}$$

$$M_{0,e1} = S_{e1,\alpha1}\frac{1 - \cos(\alpha_2)e^{-TR/T1}}{\sin(\alpha_2)(1 - e^{-TR/T1})}e^{+TE1/T2^*} \text{ and}$$

$$M_{0,e2} = S_{e2,\alpha2}\frac{1 - \cos(\alpha_2)e^{-TR/T1}}{\sin(\alpha_2)(1 - e^{-TR/T1})}e^{+TE2/T2^*} \text{ for } \alpha2,$$

where $S_{e1,\alpha1}$ is a signal of the $e_1\alpha_1$ gradient echo image, $S_{e2,\alpha1}$ is a signal of the $e_2\alpha_1$ gradient echo image, $S_{e1,\alpha2}$ is a signal of the $e_1\alpha_2$ gradient echo image, and $S_{e2,\alpha2}$ is a signal of the $e_2\alpha_2$ gradient echo image, TE1 is a time of the acquisition of the $e_1$ images, and TE2 is a time of the acquisition of the $e_2$ images.

16. A system for determining a concentration of fat within a region of a subject, comprising:

a magnetic resonance imaging scanner for acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in-phase with one another and gradient echo images $e_2\alpha_1$, and $e_2\alpha_2$ occur at an opposed-phase time when the resonance signals of fat and water are 180° out of phase with one another; and a computing device for approximating a T2* relaxation time map from the in-phase gradient echo images based on the $\alpha_1$ flip angle or the $\alpha_2$ flip angle and approximating a T1 relaxation time map from the in-phase gradient echo images based on the $\alpha_1$ flip angle and the $\alpha_2$ flip angle, distinguishing between fat and water signals within the gradient echo images based on observed relative signal phase, modulating the amplitude of the fat and water signal images using the T2* relaxation time and T1 relaxation time maps, determining a ratio between fat and water signals for one or more voxels of the gradient echo images based on the amplitude modulated fat and water signal images, and displaying the determined ratio between fat and water for a desired voxel of the gradient echo images, wherein the T2* relaxation time map is approximated from the in-phase gradient echo images according to the following equations:

$$T2^*_{\alpha1} = \frac{(TE3 - TE1)}{\ln(S_{e1,\alpha1}/S_{e3,\alpha1})} \text{ and } T2^*_{\alpha2} = \frac{(TE3 - TE1)}{\ln(S_{e1,\alpha2}/S_{e3,\alpha2})}$$

where TE1 is a time of the acquisition of the $e_1$ images, TE3 is a time of the acquisition of the $e_3$ images, $S_{e1,\alpha1}$ is a signal of the $e_1\alpha_1$ gradient echo image, $S_{e3,\alpha1}$ is a signal of the $e_3\alpha_1$ gradient echo image, $S_{e1,\alpha2}$ is a signal of the $e_1\alpha_2$ gradient echo image, and $S_{e3,\alpha2}$ is a signal of the $e_3\alpha_2$ gradient echo image.

17. The system of claim 16, wherein the gradient echo images are acquired in the following order: $e_1$ as an in-phase echo, then $e_2$ as an opposed-phase echo, and then $e_3$ as an in-phase echo.

18. The system of claim 16, wherein the gradient echo images are acquired in the following order: $e_1$ as an opposed-phase echo, then $e_2$ as an in-phase echo, and then $e_3$ as an in-phase echo.

19. The system of claim 16, wherein fat and water signals are distinguished within the gradient echo images using a two-point or three-point Dixon approach.

20. A system for determining a concentration of fat within a region of a subject, comprising:
 a magnetic resonance imaging scanner for acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in-phase with one another and gradient echo images $e_2\alpha_1$, and $e_2\alpha_2$ occur at an opposed-phase time when the resonance signals of fat and water are 180° out of phase with one another; and
 a computing device for approximating a T2* relaxation time map from the in-phase gradient echo images based on the $\alpha_1$ flip angle or the $\alpha_2$ flip angle, approximating a T1 relaxation time map from the in-phase gradient echo images based on the $\alpha_1$ flip angle and the $\alpha_2$ flip angle, distinguishing between fat and water signals within the gradient echo images based on observed relative signal phase, modulating the amplitude of the fat and water signal images using the T2* relaxation time and T1 relaxation time maps, determining a ratio between fat and water signals for one or more voxels of the gradient echo images based on the amplitude modulated fat and water signal images, and displaying the determined ratio between fat and water for a desired voxel of the gradient echo images,
 wherein the T1 relaxation time map is approximated from the in-phase gradient echo images according to the following equations:

$$T1_{e1} = \frac{-TR}{\ln\left[\frac{S_{e1,\alpha1}\sin\alpha_2 - S_{e1,\alpha2}\sin\alpha_1}{(S_{e1,\alpha1}\sin\alpha_2\cos\alpha_1) - (S_{e1,\alpha2}\sin\alpha_1\cos\alpha_2)}\right]} \text{ and}$$

$$T1_{e3} = \frac{-TR}{\ln\left[\frac{S_{e3,\alpha1}\sin\alpha_2 - S_{e3,\alpha2}\sin\alpha_1}{(S_{e3,\alpha1}\sin\alpha_2\cos\alpha_1) - (S_{e3,\alpha2}\sin\alpha_1\cos\alpha_2)}\right]}$$

wherein $S_{e1,\alpha1}$ is a signal of the $e_1\alpha_1$ gradient echo image, $S_{e3,\alpha1}$ is a signal of the $e_3\alpha_1$ gradient echo image, $S_{e1,\alpha2}$ is a signal of the $e_1\alpha_2$ gradient echo image, and $S_{e3,\alpha2}$ is a signal of the $e_3\alpha_2$ gradient echo image.

21. A system for determining a concentration of fat within a region of a subject, comprising:
 a magnetic resonance imaging scanner for acquiring at least three gradient echo images $e_1$, $e_2$, and $e_3$ of a region of a subject from at least two different flip angles $\alpha_1$ and $\alpha_2$ within a repetition time TR for a total of at least six gradient echo images $e_1\alpha_1$, $e_2\alpha_1$, $e_3\alpha_1$, $e_1\alpha_2$, $e_2\alpha_2$, and $e_3\alpha_2$, wherein gradient echo images $e_1\alpha_1$, $e_1\alpha_2$, $e_3\alpha_1$, and $e_3\alpha_2$ occur at an in-phase time when resonance signals of fat and water are in-phase with one another and gradient echo images $e_2\alpha_1$, and $e_2\alpha_2$ occur at an opposed-phase time when the resonance signals of fat and water are 180° out of phase with one another; and
 a computing device for approximating approximating a T2* relaxation time map from the in-phase gradient echo images based on the $\alpha_1$ flip angle or the $\alpha_2$ flip angle, approximating a T1 relaxation time map from the in-phase gradient echo images based on the $\alpha_1$ flip angle and the $\alpha_2$ flip angle, distinguishing between fat and water signals within the gradient echo images based on observed relative signal phase, modulating the amplitude of the fat and water signal images using the T2* relaxation time and T1 relaxation time maps, determining a ratio between fat and water signals for one or more voxels of the gradient echo images based on the amplitude modulated fat and water signal images, and displaying the determined ratio between fat and water for a desired voxel of the gradient echo images,
 wherein fat and water signals are distinguished within the gradient echo images using a two-point or three-point Dixon approach,
 wherein the gradient echo images are acquired in the following order: $e_1$ then $e_2$ then $e_3$;
 the water signal W is determined as ½ $(M_{0,e1}+M_{0,e\,2})$; and
 the fat signal F is determined as ½ $(M_{0,e1}-M_{0,e2})$,
 wherein $M_{0,e1}$ is the initial magnetization of the e1 image and $M_{0,e1}-M_{0,e2}$ is the initial magnetization of the e2 image, and
 wherein the initial magnetization of the e1 images $M_{0,e1}$ and the initial magnetization of the e2 images $M_{0,e2}$ are calculated according to the following equations:

$$M_{0,e1} = S_{e1,\alpha1}\frac{1-\cos(\alpha_1)e^{-TR/T1}}{\sin(\alpha_1)(1-e^{-TR/T1})}e^{+TE1/T2^*} \text{ and}$$

$$M_{0,e2} = S_{e2,\alpha1}\frac{1-\cos(\alpha_1)e^{-TR/T1}}{\sin(\alpha_1)(1-e^{-TR/T1})}e^{+TE2/T2^*} \text{ and } \alpha1, \text{ and}$$

$$M_{0,e1} = S_{e1,\alpha2}\frac{1-\cos(\alpha_2)e^{-TR/T1}}{\sin(\alpha_2)(1-e^{-TR/T1})}e^{+TE1/T2^*} \text{ and}$$

$$M_{0,e2} = S_{e2,\alpha2}\frac{1-\cos(\alpha_2)e^{-TR/T1}}{\sin(\alpha_2)(1-e^{-TR/T1})}e^{+TE2/T2^*} \text{ for } \alpha2,$$

where $S_{e1,\alpha1}$ is a signal of the $e_1\alpha_1$ gradient echo image, $S_{e2,\alpha1}$ is a signal of the $e_2\alpha_1$ gradient echo image, $S_{e1,\alpha2}$ is a signal of the $e_1\alpha_2$ gradient echo image, and $S_{e2,\alpha2}$ is a signal of the $e_2\alpha_2$ gradient echo image, TE1 is a time of the acquisition of the $e_1$ images, and TE2 is a time of the acquisition of the $e_2$ images.

* * * * *